(12) United States Patent
Hasan et al.

(10) Patent No.: US 9,130,532 B2
(45) Date of Patent: Sep. 8, 2015

(54) TUNABLE RF CHANNEL SELECT FILTER

(71) Applicant: Nokia Corporation, Espoo (FI)

(72) Inventors: Md. Naimul Hasan, Davis, CA (US); Sudhir Aggarwal, Fremont, CA (US)

(73) Assignee: Nokia Technologies Oy, Espoo (FI)

( * ) Notice: Subject to any disclaimer, the term of this patent is extended or adjusted under 35 U.S.C. 154(b) by 155 days.

(21) Appl. No.: 14/104,233

(22) Filed: Dec. 12, 2013

(65) Prior Publication Data

US 2015/0171819 A1 Jun. 18, 2015

(51) Int. Cl.
*H03H 7/42* (2006.01)
*H03H 7/01* (2006.01)
*H03H 7/06* (2006.01)
*H03H 11/04* (2006.01)

(52) U.S. Cl.
CPC .............. *H03H 7/0161* (2013.01); *H03H 7/06* (2013.01); *H03H 7/17* (2013.01); *H03H 7/42* (2013.01); *H03H 11/0422* (2013.01); *H03H 2007/013* (2013.01)

(58) Field of Classification Search
CPC ....... H03H 7/016; H03H 7/0184; H03H 7/06; H03H 7/17; H03H 7/42; H03H 2007/013; H03H 11/0422
See application file for complete search history.

(56) References Cited

U.S. PATENT DOCUMENTS

| | | | |
|---|---|---|---|
| 3,794,938 A * | 2/1974 | Boelter ........................... | 333/168 |
| 4,805,126 A * | 2/1989 | Rodems ......................... | 702/106 |
| 6,404,279 B2 * | 6/2002 | Thomasson ................... | 327/557 |
| 7,990,209 B2 * | 8/2011 | Romero ......................... | 327/556 |
| 8,164,380 B2 * | 4/2012 | Hosokawa et al. ............ | 327/554 |
| 2007/0140391 A1 * | 6/2007 | Pan ................................ | 375/350 |
| 2009/0286501 A1 * | 11/2009 | Rousu et al. .................. | 455/323 |
| 2010/0244945 A1 * | 9/2010 | Hahn et al. .................... | 327/553 |
| 2013/0162374 A1 * | 6/2013 | Tamiazzo et al. ............. | 333/202 |
| 2013/0335200 A1 * | 12/2013 | Jonely ........................... | 340/10.5 |
| 2015/0133068 A1 * | 5/2015 | Aggarwal et al. .......... | 455/176.1 |
| 2015/0171819 A1 * | 6/2015 | Hasan et al. .......... | H03H 7/0161 |

FOREIGN PATENT DOCUMENTS

WO 01/56156 A1 8/2001

OTHER PUBLICATIONS

International Search Report and Written Opinion received for corresponding Patent Cooperation Treaty Application No. PCT/FI2014/050916, dated Feb. 13, 2015, 15 pages.
Ghaffari et al., "Tunable N-Path Notch Filters for Blocker Suppression: Modeling and Verification", IEEE Journal of Solid-State Circuits, vol. 48, No. 6, Jun. 2013, pp. 1370-1382.
Ghaffari et al., "Tunable High-Q N-Path Band-Pass Filters: Modeling and Verification", IEEE Journal of Solid-State Circuits, vol. 46, No. 5, May 2011, pp. 998-1010.
Hasan et al., "Reconfigurable N-Path RF Front-End Filter With Improved Blocker Rejection", IEEE 57th International Midwest Symposium on Circuits and Systems, Aug. 3-6, 2014, pp. 69-72.
Ghaffari et al., "8-Path Tunable RF Notch Filters for Blocker Suppression", IEEE International Solid-State Circuits Conference Digest of Technical Papers, Feb. 19-23, 2012, pp. 76-78.

(Continued)

*Primary Examiner* — Thomas J Hiltunen
(74) *Attorney, Agent, or Firm* — Nokia Technologies Oy

(57) ABSTRACT

Methods and apparatus, including computer program products, are provided for RF filtering. Related apparatus, systems, methods, and articles are also described.

17 Claims, 10 Drawing Sheets

100

(56) References Cited

OTHER PUBLICATIONS

Darvishi et al., "Widely Tunable 4th Order Switched Gm-C Band-Pass Filter Based on N-Path Filters", IEEE Journal of Solid-State Circuits, vol. 47, Issue 12, Dec. 2012, pp. 3105-3119.

Darvishi et al., "A 0.1-to-1.2GHz Tunable 6th-Order N-Path Channel-Select Filter with 0.6dB Passband Ripple and +7dBm Blocker Tolerance", IEEE International Solid-State Circuits Conference Digest of Technical Papers, Feb. 17-21, 2013, pp. 172-173.

Franks et al., "An Alternative Approach to the Realization of Network Transfer Functions: The N-Path Filter", The Bell Syatem Technical Journal, vol. 39, Issue 5, Sep. 1960, pp. 1321-1350.

\* cited by examiner

500

US 9,130,532 B2

TUNABLE RF CHANNEL SELECT FILTER

FIELD

The subject matter described herein relates to filters.

BACKGROUND

A radio receiver may handle large out-of-band interferers (blockers) and recover a weak desired signal in presence of other in-band and out-of-band interferers. As such, the receiver may need to be able to process the desired channel while sufficiently rejecting strong-in-band and out-of-band interferers. These interfering signals near the desired signal may need to be suppressed. To that end, a band selection filter may provide attenuation for out-of-band signals, and a subsequent baseband lowpass channel filter may provide channel selection. Some currently available filters may not be able to provide channel selection at the radio frequency (RF)-level because of the extremely high quality (high-Q) requirements required to perform channel selection. Moreover, some band selection filters may not be tunable across a plurality of bands.

SUMMARY

In some example embodiments, there is provided an apparatus. The apparatus may include a first bandpass filter to receive a differential signal, wherein the first bandpass filter comprises a resistive-capacitive configuration of N-path filters tunable to a first center frequency; a first notch filter to receive a first output of the first bandpass filter, wherein the first notch filter comprises a capacitive-resistive configuration of N-path filters tunable to a first notch center frequency; a second bandpass filter to receive a second output of the first notch filter, wherein the second bandpass filter comprises a resistive-capacitive configuration of N-path filters tunable to the first center frequency; a second notch filter to receive a third output of the second bandpass filter, wherein the second notch filter comprises a capacitive-resistive configuration of N-path filters tunable to a second notch center frequency; and a third bandpass filter to receive a fourth output of the second notch filter and to provide a filtered output of the apparatus, wherein the third bandpass filter comprises a resistive-capacitive configuration of N-path filters tunable to the first center frequency.

In some variations, one or more of the features disclosed herein including the following features can optionally be included in any feasible combination. The first notch center frequency may be offset in frequency at least one of above and below the first center frequency. The second notch center frequency may be offset in frequency at least one of above and below the first center frequency. The first notch filter may include a first feedforward transconductance amplifier and a second feedback transconductance amplifier configured to provide frequency shifting at the first notch filter. The second notch filter may further include a first feedforward transconductance amplifier and a second feedback transconductance amplifier configured to provide frequency shifting at the second notch filter. The first transconductance amplifier may amplify the first output provided to the first bandpass filter. The second transconductance amplifier may amplify the second output provided by the first notch filter. A balun may be coupled to the first bandpass filter to provide the differential signal input to the first bandpass filter.

The above-noted aspects and features may be implemented in systems, apparatus, methods, and/or articles depending on the desired configuration. The details of one or more variations of the subject matter described herein are set forth in the accompanying drawings and the description below. Features and advantages of the subject matter described herein will be apparent from the description and drawings, and from the claims.

Figure 1:
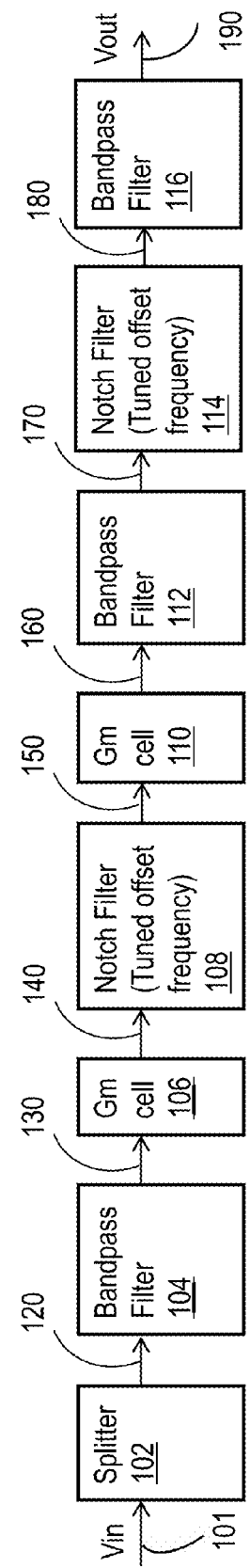
FIG. 1 depicts an example of a tunable bandpass filter, in accordance with some example embodiments.

Like labels are used to refer to same or similar items in the drawings.

DETAILED DESCRIPTION

FIG. 1 depicts a block diagram of a tunable bandpass filter 100, in accordance with some example embodiments. The tunable bandpass filter 100 may include a splitter 102, a tunable bandpass filter 104, a transconductance amplifier 106, a tunable notch filter 108, a second transconductance amplifier 110, a tunable bandpass filter 112, a tunable notch filter 114, and a tunable bandpass filter 116. The tunable bandpass filter 100 may be used for band selection and/or channel-selection. Moreover, tunable bandpass filter 100 may, in some example embodiments, have a high stop-band rejection. Furthermore, tunable bandpass filter 100 may, in some example embodiments, be based on an elliptic filter technology, although other filter technologies maybe used as well.

The splitter 102 may, in some example embodiments, receive an input signal, Vin, 101 which may be a single-ended signal being filtered by tunable bandpass filter 100. The splitter 102 may, in some example embodiments, output a differential output signal 120.

In some example embodiments, the differential output signal 120 may be provided as a differential input signal to a tunable bandpass filter 104, such as a tunable bandpass filter comprising N-path filters. The output of the tunable bandpass N-path filter 104 may then be provided to a transconductance amplifier 106 (labeled $g_m$-cell). The transconductance amplifier 106 may provide gain, which may facilitate noise reduction in subsequent stages. The output 140 of the transconductance amplifier 106 may be coupled to an input of a tunable notch filter 108, which provides output signal 150.

In some example embodiments, the center frequency of the notch filter 108 (as well as notch filter 114 described below) may be shifted to an offset frequency different from the center frequency of the bandpass filter 104. For example, the center frequency of notch filters 108 and/or 114 may be 20 MHz below (or above) the center frequency of the bandpass filter 104. The notch filters (which are offset in frequency) may sharpen the frequency response of filter 100 around the center frequency of the bandpass filters 104, 112, and 116, which may increase the stopband rejection. A complex impedance may be realized by using two identical real impedances, as an example a capacitor in this case and two transconductors. The complex impedance may receive a complex current and may generate a complex response voltage. A voltage dependent current source may sense the imaginary voltage and may inject a current to a real port (and vice versa) which realizes frequency shifting (Δf) of the baseband complex impedance at a notch filter. Depending on whether Gm is positive or negative, the frequency shifting is negative or positive, respectively. The tunable notch N-path filter 204 may be used to up-convert this frequency-shifted complex impedance to the filter clock frequency (fclk) as shown in for example FIG. 2A where, fclk=1/Tclk, thereby the notch is created at (fclk+Δf) or (fclk−Δf) depending on the sign of gm cell. As such, the notch filters 108 and/or 114 are offset in frequency with respect to the center frequency of the bandpass filters 104, 112, and 116 (which in this example is at fclk), and this offset effectively provides a higher-Q filter. Although the previous example describes a notch filter offset frequency of 20 MHz below the center frequency of the bandpass filter, other offsets may be realized as well.

In some example embodiments, a second transconductance amplifier 110 (labeled Gm-cell) may receive output 150 and provide amplified output 160. This second transconductance amplifier 110 may be placed after the notch filter 108, and may serve to provide gain and/or enable noise reduction in subsequent stages.

In some example embodiments, a second tunable bandpass filter 112, such as an N-path bandpass filter, may be coupled to the output 160 of second transconductance amplifier 110. The output 170 of N-path bandpass filter 112 may then be provided as an input to a tunable notch filter, such as N-path notch filter 114. The N-path notch filter 114 may be configured with a center frequency different than bandpass filter 112. For example, N-path notch filter 114 may have a center frequency 20 MHz above the center frequency of the bandpass filter 112. The notch frequency may be shifted using feedforward and feedback gm cells 292A-B and $C_4$. By changing the polarity of the gm cells (as an example input and/or output), the center frequency of the notch filter 114 may be shifted to the right.

In some example embodiments, a tunable bandpass filter 116, such as a tunable N-path filter, may receive the output 180 of notch filter 114 and provide filtered output, Vout 190.

In some example embodiments, the center frequency of individual bandpass filters 104, 112, and 116 may be similar or the same. Moreover, the center frequency of bandpass filters 104, 112, and 116 may define the center frequency of tunable bandpass filter 100. The center frequencies of the notch filters 108 and 114 may be configured with center frequencies different from the bandpass filters 104, 112, and 116 as noted above. The notch filters 108 and 114 may each be configured to create zeros in the transfer function of the filter at offset frequencies of the filter. By creating zeros outside the bandwidth of the filter, the stopband rejection of the filter may be increased compared with an all pole filter. By choosing the offset frequencies (with respect to the clock frequency fclk) of the notch filters 108 and 114, the overall filter shape, bandwidth and attenuation may be controlled around the clock frequency fclk. Although the previous example describes the same frequency offset at notch filters 104 and 114, different offsets may be used at each filter as well. Moreover, the example values of 20 MHz are merely examples, as other values may be used as well.

In some example embodiments, the center frequency of the notch filters 108 and 114 may be independently selected irrespective of the center frequency of the bandpass filters 104, 112, and 116. Depending on the desired bandwidth and sharpness of attenuation, the offset frequencies of notch filter 108 and 114 may be chosen.

Figure 2A:
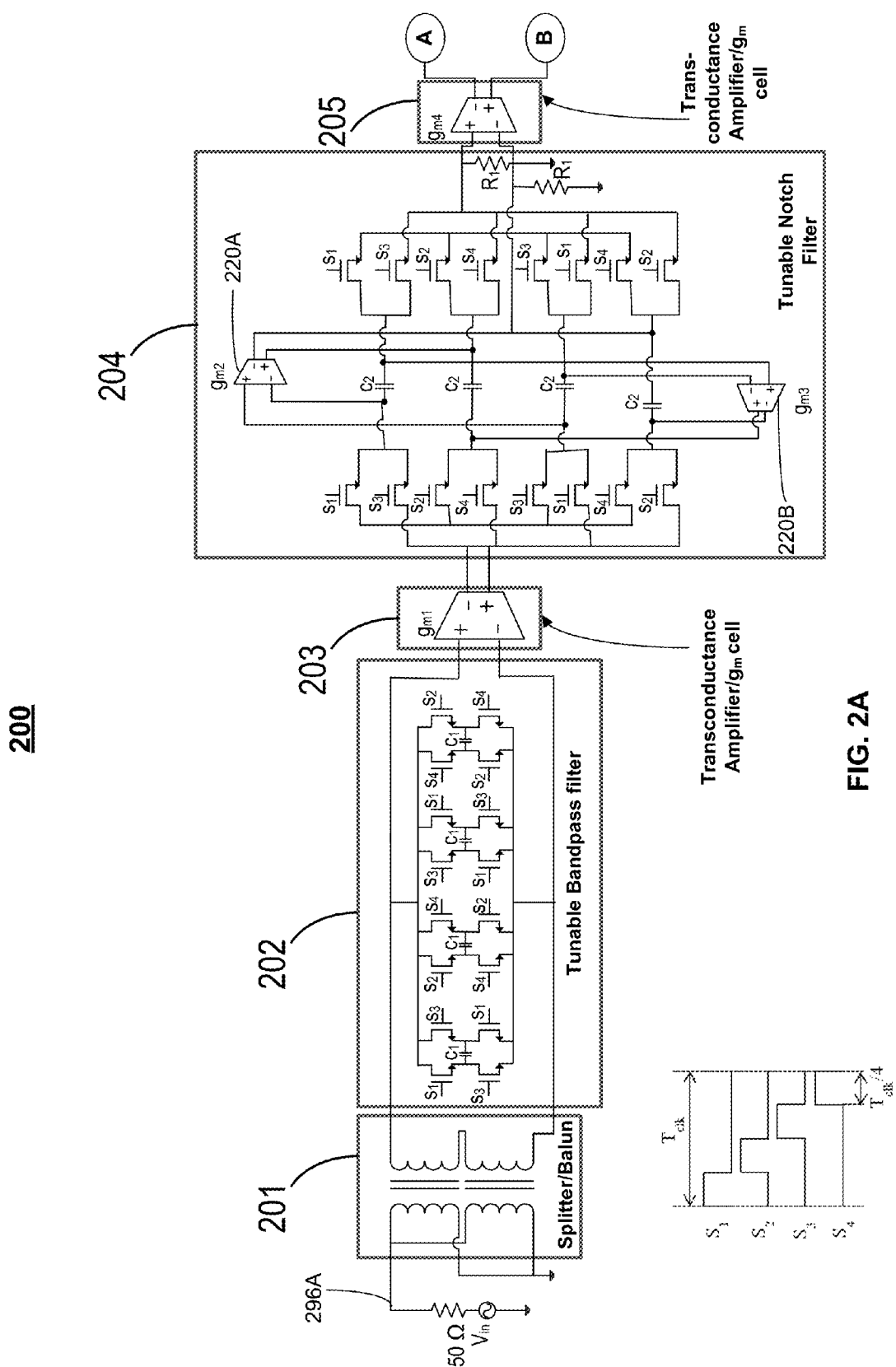
FIGS. 2A-2B depict an example of a tunable bandpass filter, in accordance with some example embodiments.
Figure 2B:
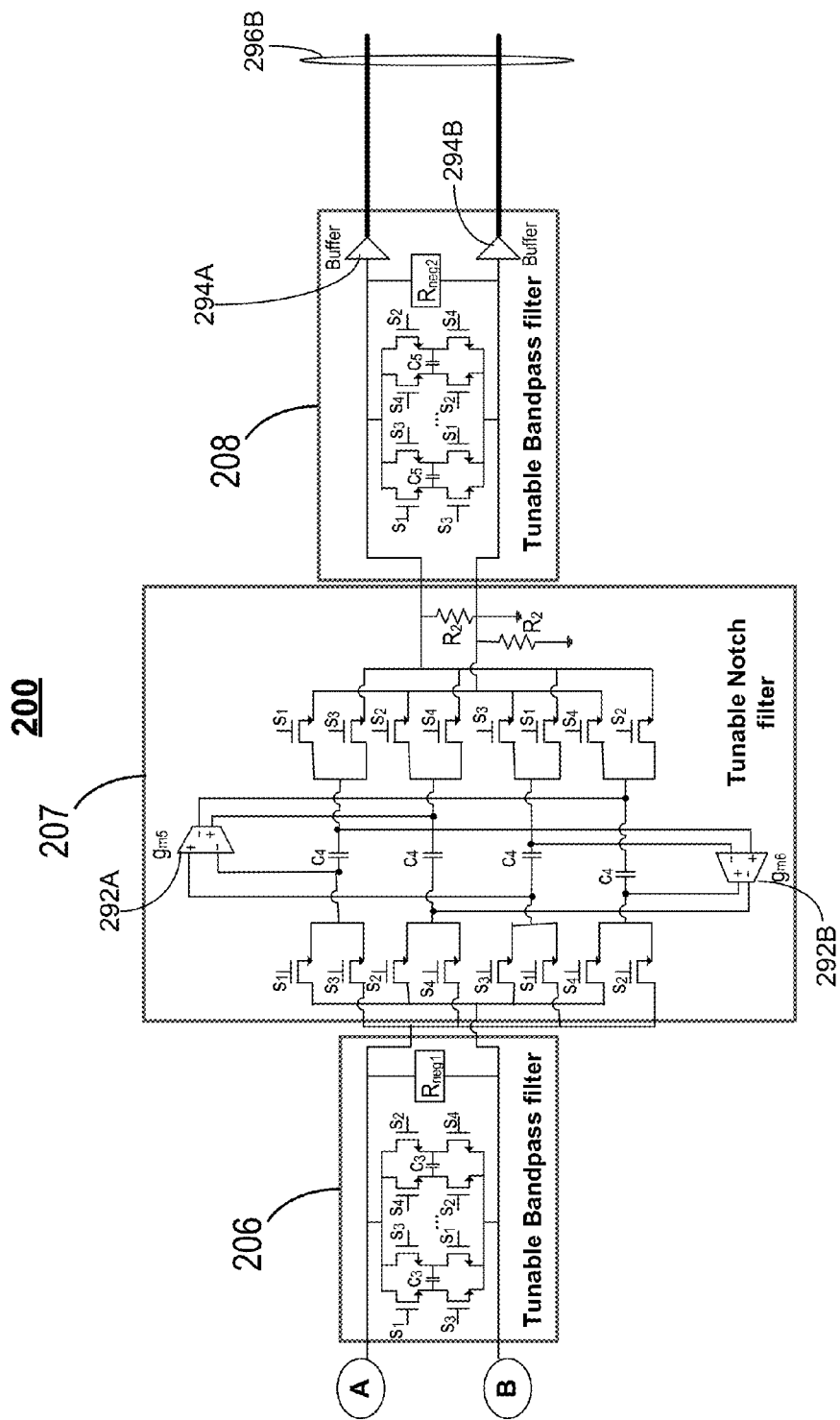

FIGS. 2A-B depict an example implementation of a tunable bandpass filter 200, in accordance with some example embodiments. A signal to be filtered by tunable bandpass filter 200 may be received at 296A as an input ($V_{in}$) and then filtered by tunable bandpass filter 200, yielding differential output signal 296B.

The tunable bandpass filter 200 may include a splitter 201, a tunable bandpass filter 202, a transconductance amplifier 203, a tunable notch filter 204, a second transconductance amplifier 205, a tunable bandpass filter 206, a tunable notch filter 207, and a tunable bandpass filter 208. The tunable bandpass filter 200 may tune over one or more frequency bands and/or may be used for channel-selection. In some example embodiments, tunable bandpass filter 200 may be based on an elliptic filter technology, although other filter technologies maybe used as well.

In some example embodiments, a balun 201 may split an input signal 101 into to differential voltage signals. The differential voltage output signal of balun 201 may, in accordance with some example embodiments, be coupled to a tunable bandpass filter 202, such as a resistive-capacitive (R-C) configuration of an N-path filter. The tunable bandpass filter 202 output may couple to the differential input of transconductance amplifier 203.

In some example embodiments, the transconductance amplifier 203 may be implemented as two transconductance ($g_m$) cells of the same or similar type given the differential architecture of filter 200.

Figure 3:
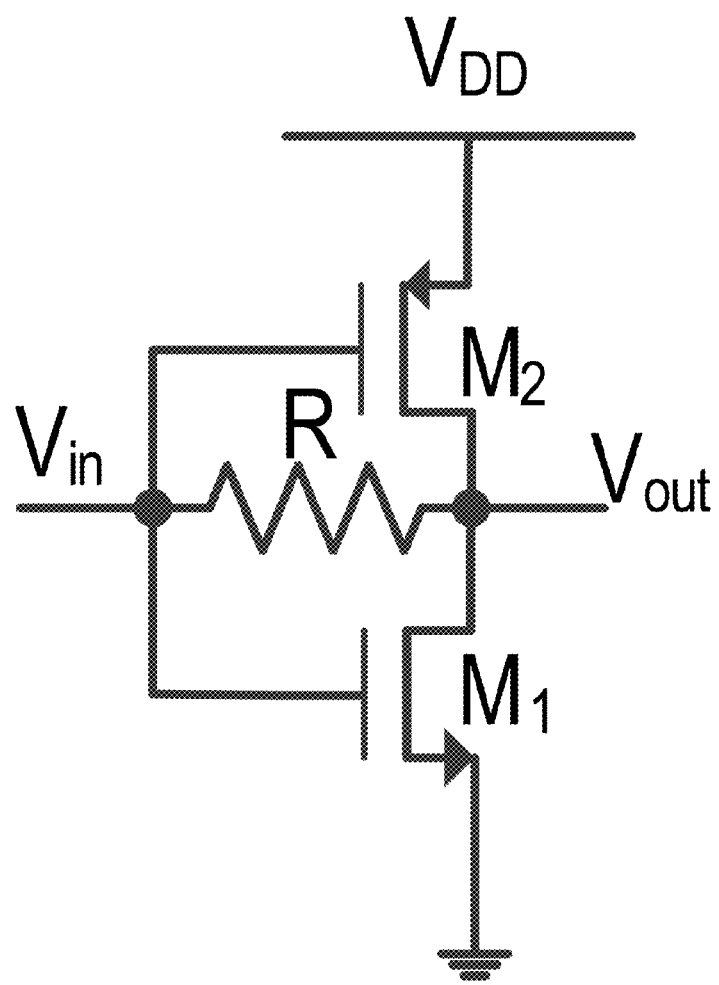
FIG. 3 depicts an example of a transconductance amplifier cell implemented with an inverter, in accordance with some example embodiments.

FIG. 3 depicts an example implementations of transconductance amplifier cell 203 implemented with self-biased inverters as shown in FIG. 3. Lower threshold voltage devices may be used for the input transistors, $M_1$ and $M_2$, to provide lower parasitic capacitance (which may reduce noise figure). The feedback resistor, R, may hold the output voltage level, Vout, as $V_{DD}/2$. In some example embodiments, a plurality of identical transconductance ($g_m$) amplifier cells 300 may be used to implement transconductance amplifier 203 in order to provide gain and/or a noise figure reduction.

Referring again to FIG. 2, the differential output of transconductance amplifier 203 may be provided to a tunable notch filter 204, which may be implemented as a capacitive-resistive (C-R) configuration of N-path filters.

In some example embodiments, the resonant (or center) frequency of the notch filter 204 may be shifted by using two transconductance, $g_m$, cells 220A-B (labeled $g_{m2}$ and $g_{m3}$). The $g_m$ cells 220A-B may be implemented differently when compared to the $g_m$ cell 300. The differential input voltage of transconductor $g_{m5}$ may provide current output in the quadrature phase part of capacitor $C_4$. Similarly, the input voltage of $g_{m6}$ may provide current output to the quadrature part of capacitor $C_4$. This may effectively result in the frequency shift of the notch.

Figure 4:
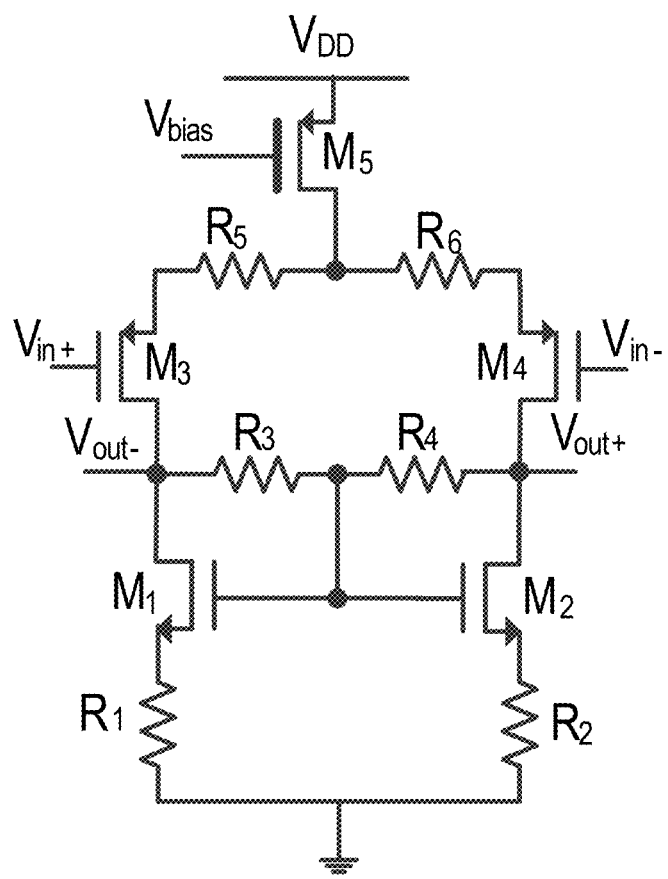
FIG. 4 depicts an example of a transconductance amplifier cell which may be used for frequency shifting, in accordance with some example embodiments.

FIG. 4 depicts an example of a $g_m$ cell 400, which may be used at each of $g_m$ cells 220A-B ($g_{m2}$ and $g_{m3}$) to provide frequency shifting noted with respect to tunable notch filter 204. The frequency shifting provided by $g_m$ cells 220A-B may be determined in accordance with the following:

$$\frac{g_{m2,3}}{2\pi C_{BB}}$$

wherein $C_{BB}$ is combination of $C_2$ and the parasitic capacitances of the transistor switches.

By adjusting the values of cells $g_{m2,3}$ (220A-B) and $C_2$, the center frequency is shifted of the N-path implementation of the notch filter 204 with feed-forward and feedback gm cells 220A-B (for example 20 MHz lower than the center frequency of the filter).

To compensate the loss from the notch filter 204 and to reduce the noise from subsequent stages, another transconductance amplifier ($g_m$ cell) 205 may be coupled to the output of notch filter 204. The transconductance amplifier 205 may be implemented in the same or similar manner as the transconductance amplifier 300 (described further below).

Figure 5:
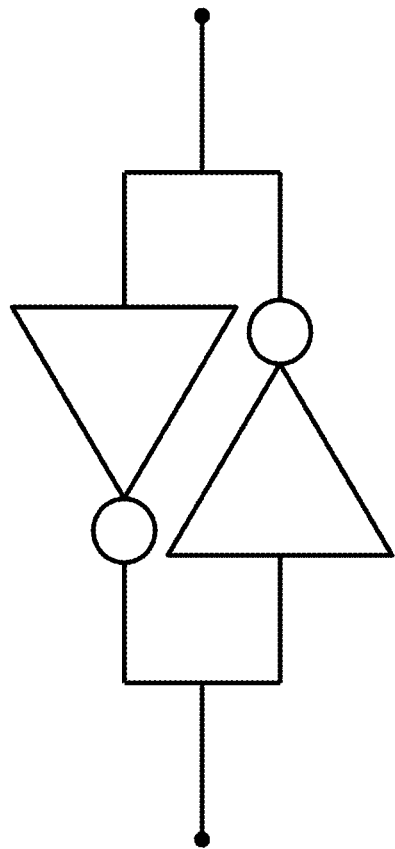
FIG. 5 depicts an example of back-to-back inverters configured to provide a negative resistance, in accordance with some example embodiments.

The next bandpass filter 206 may, in some example embodiments, be implemented by tunable N-path filters in an R-C configuration 206. The negative resistances ($R_{neg1}$) may be implemented with for example back-to-back inverters 500 as shown in FIG. 5. The negative resistor ($R_{neg1}$) may have a separate supply voltage with for example a nominal value of 1.2 volts, although other values may be used as well. The parasitic capacitance at each node of the filter modifies the equivalent resistance of that node which is frequency dependent. As the clock frequency decreases, the Q-factor of the filter 200 increases leading to higher ripples in the pass-band of the filter 200 for low clock frequencies. As such, the supply voltage of the negative resistors may be reduced for low clock frequencies to reduce these ripples.

The tunable second notch filter 207 may, in some example embodiments, be implemented as N-path filters configured in a C-R configuration as shown at FIG. 2B. The center frequency of the notch filter 207 may be shifted by for example 20 MHz above the center frequency of the bandpass filters 202, 206, and 208 by changing the connections (as an example, input and output) of the gm cells 292A-B (labeled $g_{m5}$ and $g_{m6}$). The frequency shifting may be determined by the following:

$$\frac{g_{m5,6}}{2\pi C'_{BB}}$$

wherein $C'_{BB}$ is the combination of $C_4$ and the parasitic capacitances of the transistor switches. Although the previous example as well as other examples herein refer to a specific offset, other offset values may be used as well.

In some example embodiments, tunable bandpass filter 208 may be implemented using N-path filters in an R-C configuration. Two buffers 294A-B may be provided at the differential output 296B of the filter 200.

Figure 6:
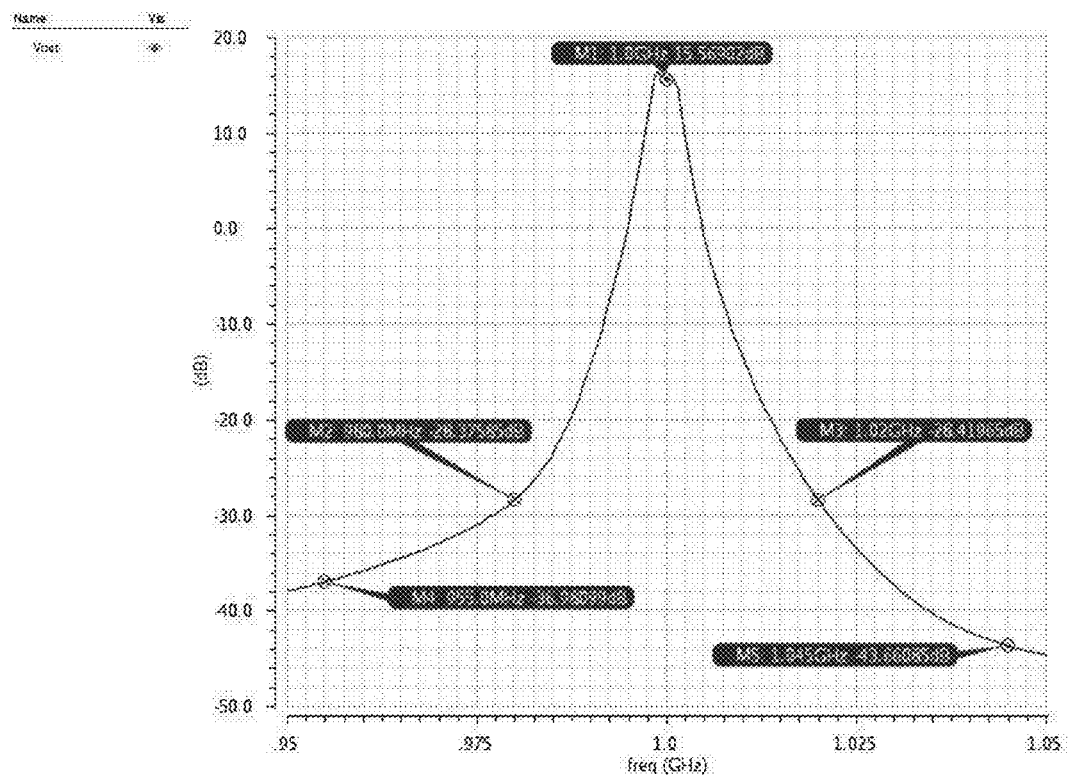
FIGS. 6-8 depict example frequency spectrum plots for tunable bandpass filters, in accordance with some example embodiments.
Figure 7:
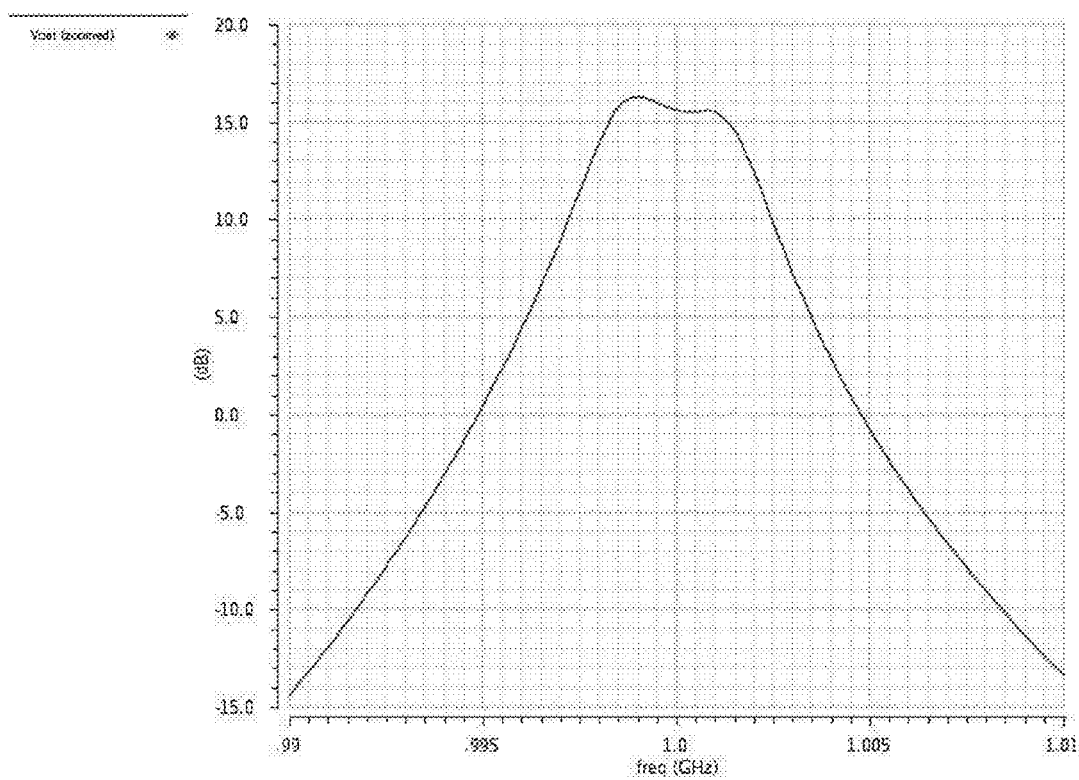

FIG. 6 depicts an example plot of magnitude (in decibels, dB) versus frequency (in Gigahertz, GHz) for the tunable filter 200. FIG. 7 depicts a zoomed-in version of FIG. 6. As can be seen, the tunable filter 200 may provide a band and/or channel selection filter. Moreover, the pass band ripple, in some example implementations, may be relatively small (for example, less than about 0.4 dB). Unlike passive filters, the tunable filter 200 may provide a gain (for example, 15.5 dB) as shown in FIGS. 6 and 7. In some example implementations, the tunable filter 100 or 200 may have about a 44 dB rejection at a 20 MHz offset and have at least 52.54 dB rejection at 45 MHz offset from the center frequency as shown in FIG. 6, although other results may be obtained as well.

Figure 8:
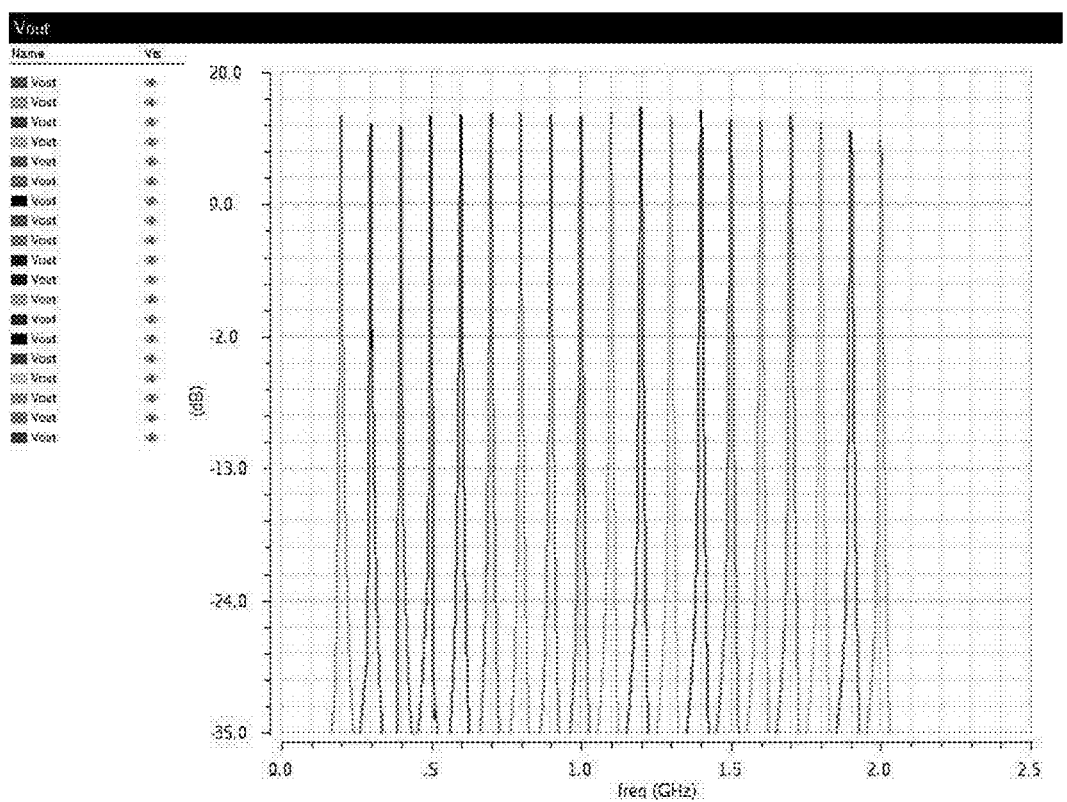

FIG. 8 depicts the tunablity of filter 200 from 0.2 GHz to 2 GHz. The tuning moves the pass band across the spectrum, while substantially maintaining stop-band rejection over the wide frequency band as shown in FIG. 8. The filter may be tuned by changing the frequency of a four-phase clock. The four-phase clock is shown at the bottom in FIG. 2A. The stop-band rejection may be higher when compared with an $8^{th}$ order all pole Butterworth filter. The high stop-band rejection may be due in part to the notches created outside the bandwidth of the filter 100/200. The notches may also be independently tuned.

In some example embodiments, the tunable filter 100/200 disclosed herein may be integrated into a RF transceiver, such as at a receiver and/or a transmitter. When this is the case, filter 100/200 may enable elimination of several band-specific, bulky, and costly SAW filters and the elimination of fixed band/channel selection filters from for example cellular transceivers as the filter 100/200 may be used for band tuning and/or channel selection. Moreover, filter 100/200 may be a tracking filter, so filter 100/200 may be used as part of a reconfigurable multiband radio with variable bandwidth, which may be utilized in cellular transceivers.

Figure 9:
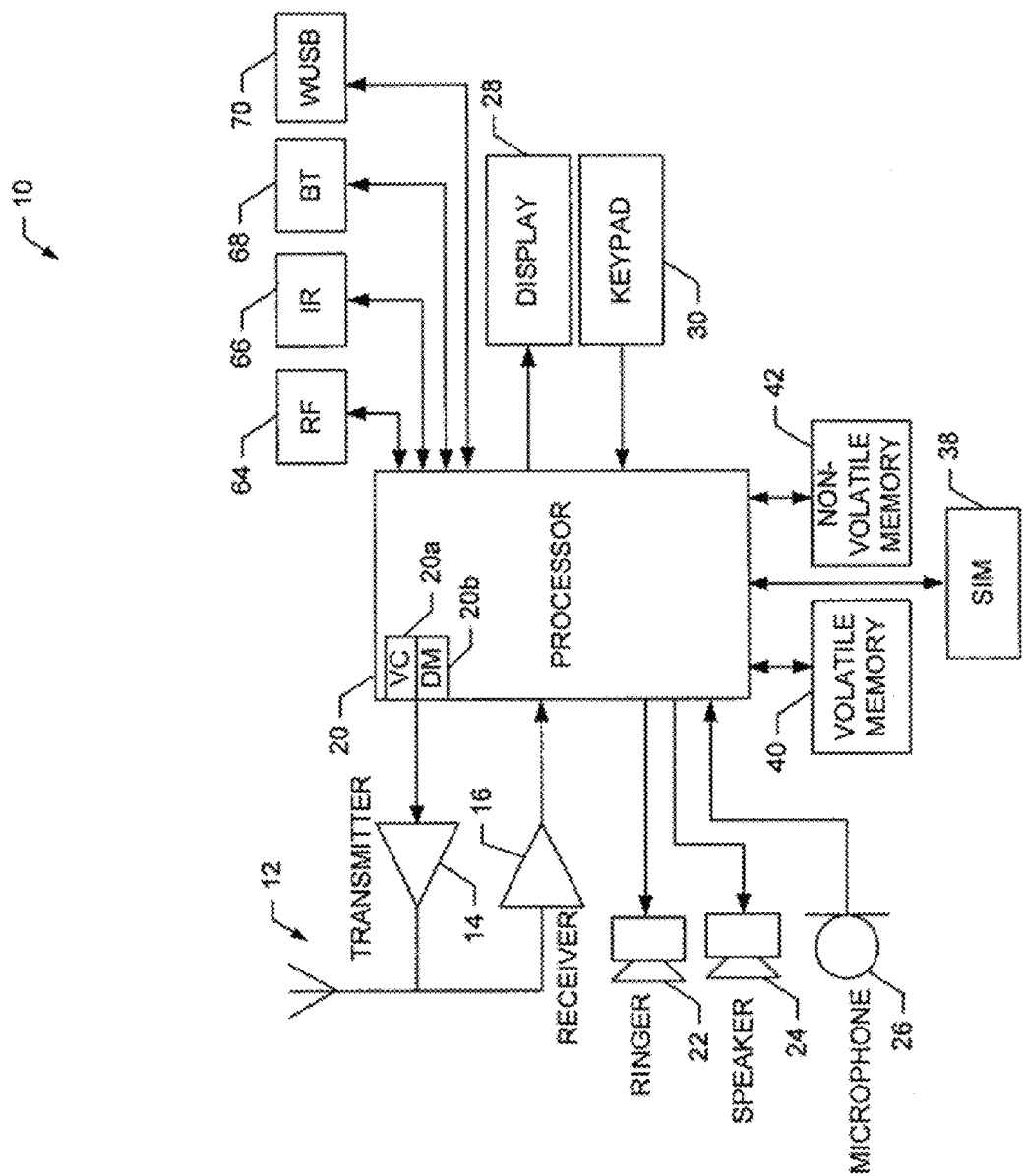
FIG. 9 depicts an example of a transceiver, in accordance with some example embodiments.

FIG. 9 illustrates a block diagram of an apparatus 10, in accordance with some example embodiments. For example, apparatus 10 may comprise a radio, such as a user equipment, a smart phone, mobile station, a mobile unit, a subscriber station, a wireless terminal, a tablet, a wireless plug-in accessory, a wireless access point, a base station, and/or or any other device with device having a transceiver.

The apparatus 10 may include at least one antenna 12 in communication with a transmitter 14 and a receiver 16. Alternatively transmit and receive antennas may be separate.

In some example embodiments, the tunable filters 100/200 disclosed herein may be used in the transmitter 14 and/or receiver 16 for RF band selection and/or channel selection. Moreover, the processor 20 may execute code stored in memory to control the tuning of the tunable filters 100/200, in accordance with some example embodiments.

The apparatus 10 may also include a processor 20 configured to provide signals to and receive signals from the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 10 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Accordingly, although illustrated in FIG. 9 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as Institute of Electrical and Electronics Engineers (IEEE) 802.11, 802.16, and/or the like. In addition, these signals may include speech data, user generated data, user requested data, and/or the like.

The apparatus 10 may be capable of operating with one or more air interface standards, communication protocols, modulation types, access types, and/or the like. For example, the apparatus 10 and/or a cellular modem therein may be capable of operating in accordance with various first generation (1G) communication protocols, second generation (2G or 2.5G) communication protocols, third-generation (3G) communication protocols, fourth-generation (4G) communication protocols, Internet Protocol Multimedia Subsystem (IMS) communication protocols (for example, session initiation protocol (SIP) and/or the like. For example, the apparatus 10 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 10 may be capable of operating in accordance with 2.5G wireless communication protocols General Packet Radio Service (GPRS), Enhanced Data GSM Environment (EDGE), and/or the like. Further, for example, the apparatus 10 may be capable of operating in accordance with 3G wireless communication protocols, such as Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 10 may be additionally capable of operating in accordance with 3.9G wireless communication protocols, such as Long Term Evolution (LTE), Evolved Universal Terrestrial Radio Access Network (E-UTRAN), and/or the like. Additionally, for example, the apparatus 10 may be capable of operating in accordance with 4G wireless communication protocols, such as LTE Advanced and/or the like as well as similar wireless communication protocols that may be subsequently developed.

It is understood that the processor 20 may include circuitry for implementing audio/video and logic functions of apparatus 10. For example, the processor 20 may comprise a digital signal processor device, a microprocessor device, an analog-to-digital converter, a digital-to-analog converter, and/or the like. Control and signal processing functions of the apparatus 10 may be allocated between these devices according to their respective capabilities. The processor 20 may additionally comprise an internal voice coder (VC) 20a, an internal data modem (DM) 20b, and/or the like. Further, the processor 20 may include functionality to operate one or more software programs, which may be stored in memory. In general, processor 20 and stored software instructions may be configured to cause apparatus 10 to perform actions. For example, processor 20 may be capable of operating a connectivity program, such as a web browser. The connectivity program may allow the apparatus 10 to transmit and receive web content, such as location-based content, according to a protocol, such as wireless application protocol, WAP, hypertext transfer protocol, HTTP, and/or the like.

Apparatus 10 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 10 may include a battery for powering various circuits related to the mobile terminal, for example, a circuit to provide mechanical vibration as a detectable output. The user input interface may comprise devices allowing the apparatus 20 to receive data, such as a keypad 30 (which can be a virtual keyboard presented on display 28 or an externally coupled keyboard) and/or other input devices.

As shown in FIG. 9, apparatus 10 may also include one or more mechanisms for sharing and/or obtaining data. For example, the apparatus 10 may include a short-range radio frequency (RF) transceiver and/or interrogator 64, so data may be shared with and/or obtained from electronic devices in accordance with RF techniques. The apparatus 10 may include other short-range transceivers, such as an infrared (IR) transceiver 66, a Bluetooth (BT) transceiver 68 operating using Bluetooth wireless technology, a wireless universal serial bus (USB) transceiver 70, a Bluetooth Low Energy transceiver, a ZigBee transceiver, an ANT transceiver, a cellular device-to-device transceiver, a wireless local area link transceiver, and/or any other short-range radio technology. Apparatus 10 and, in particular, the short-range transceiver may be capable of transmitting data to and/or receiving data from electronic devices within the proximity of the apparatus, such as within 10 meters, for example. The apparatus 10 including the WiFi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 10 may comprise memory, such as a subscriber identity module (SIM) 38, a removable user identity module (R-UIM), an eUICC, an UICC, and/or the like, which may store information elements related to a mobile subscriber. In addition to the SIM, the apparatus 10 may include other removable and/or fixed memory. The apparatus 10 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus for performing the functions the apparatus including providing and/or controlling the tunable filters 100/200. The memories may comprise an identifier, such as an international mobile equipment identification (IMEI) code, capable of uniquely identifying apparatus 10. The functions may include one or more of the operations disclosed herein with providing and/or controlling the tunable filters 100/200 and the like. The memories may comprise an identifier, such as an international mobile equipment identification (IMEI) code, capable of uniquely identifying apparatus 10. In the example embodiment, the processor 20 may be configured using computer code stored at memory 40 and/or 42 to operations disclosed herein with respect to tunable filters 100/200 (for example, providing one or more aspects of the tunable filters 100/200 and/or controlling the tuning of the filters 100/200).

Some of the embodiments disclosed herein may be implemented in software, hardware, application logic, or a combination of software, hardware, and application logic. The software, application logic, and/or hardware may reside on memory 40, the control apparatus 20, or electronic components, for example. In some example embodiment, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry, with examples depicted at FIG. 9, computer-readable medium may comprise a non-transitory computer-readable storage medium that may be any media that can contain or store the instructions for use by or in connection with an instruction execution system, apparatus, or device, such as a computer. For example, the computer-readable medium may include computer program code which when executed by processor circuitry provides control of the tuning of tunable band pass filter disclosed herein.

Without in any way limiting the scope, interpretation, or application of the claims appearing below, a technical effect of one or more of the example embodiments disclosed herein is a tracking filter that may be used in cellular radios.

If desired, the different functions discussed herein may be performed in a different order and/or concurrently with each other. Furthermore, if desired, one or more of the above-described functions may be optional or may be combined. Although various aspects of the invention are set out in the independent claims, other aspects of the invention comprise other combinations of features from the described embodiments and/or the dependent claims with the features of the independent claims, and not solely the combinations explicitly set out in the claims. It is also noted herein that while the above describes example embodiments, these descriptions should not be viewed in a limiting sense. Rather, there are several variations and modifications that may be made without departing from the scope of the present invention as defined in the appended claims. Other embodiments may be within the scope of the following claims. The term "based on" includes "based on at least." The use of the phase "such as" means "such as for example" unless otherwise indicated.

What is claimed is:

1. An apparatus comprising:
   a first bandpass filter to receive a differential signal, wherein the first bandpass filter comprises a resistive-capacitive configuration of N-path filters tunable to a first center frequency;
   a first notch filter to receive a first output of the first bandpass filter, wherein the first notch filter comprises a capacitive-resistive configuration of N-path filters tunable to a first notch center frequency;
   a second bandpass filter to receive a second output of the first notch filter, wherein the second bandpass filter comprises a resistive-capacitive configuration of N-path filters tunable to the first center frequency;
   a second notch filter to receive a third output of the second bandpass filter, wherein the second notch filter comprises a capacitive-resistive configuration of N-path filters tunable to a second notch center frequency; and
   a third bandpass filter to receive a fourth output of the second notch filter and to provide a filtered output of the apparatus, wherein the third bandpass filter comprises a resistive-capacitive configuration of N-path filters tunable to the first center frequency.

2. The apparatus of claim 1, wherein the first notch center frequency is offset in frequency at least one of above and below the first center frequency.

3. The apparatus of claim 1, wherein the second notch center frequency is offset in frequency at least one of above and below the first center frequency.

4. The apparatus of claim 1, wherein the first notch filter further includes a first feedforward transconductance amplifier and a second feedback transconductance amplifier configured to provide frequency shifting of the first notch center frequency.

5. The apparatus of claim 1, wherein the second notch filter further includes a first feedforward transconductance amplifier and a second feedback transconductance amplifier configured to provide frequency shifting of the second notch center frequency.

6. The apparatus of claim 1 further comprising:
   a first transconductance amplifier to amplify the first output provided to the first bandpass filter.

7. The apparatus of claim 1 further comprising:
   a second transconductance amplifier to amplify the second output provided by the first notch filter.

8. The apparatus of claim 1 further comprising:
   a balun coupled to the first bandpass filter to provide the differential signal input to the first bandpass filter.

9. A method comprising:
   receiving, at a first bandpass filter, a differential signal, wherein the first bandpass filter comprises a resistive-capacitive configuration of N-path filters tunable to a first center frequency;
   receiving, at a first notch filter, a first output of the first bandpass filter, wherein the first notch filter comprises a capacitive-resistive configuration of N-path filters tunable to a first notch center frequency;
   receiving, at a second bandpass filter, a second output of the first notch filter, wherein the second bandpass filter comprises a resistive-capacitive configuration of N-path filters tunable to the first center frequency;
   receiving, at a second notch filter, a third output of the second bandpass filter, wherein the second notch filter comprises a capacitive-resistive configuration of N-path filters tunable to a second notch center frequency;
   receiving, at a third bandpass filter, a fourth output of the second notch filter, wherein the third bandpass filter comprises a resistive-capacitive configuration of N-path filters tunable to the first center frequency; and
   outputting, by the third bandpass filter, a filtered output.

10. The method of claim 9, wherein the first notch center frequency is offset in frequency at least one of above and below the first center frequency.

11. The method of claim 9, wherein the second notch center frequency is offset in frequency at least one of above and below the first center frequency.

12. The method of claim 9, wherein the first notch filter further includes a first feedforward transconductance amplifier and a second feedback transconductance amplifier configured to provide frequency shifting of the first notch center frequency.

13. The method of claim 9, wherein the second notch filter further includes a first feedforward transconductance amplifier and a second feedback transconductance amplifier configured to provide frequency shifting of the second notch center frequency.

14. The method of claim 9 further comprising:
amplifying, by a first transconductance amplifier, the first output provided to the first bandpass filter.

15. The method of claim 9 further comprising:
amplifying, by a second transconductance amplifier, the second output provided by the first notch filter.

16. The method of claim 9, wherein a balun provides the differential signal to the first bandpass filter.

17. A non-transitory computer-readable storage medium including computer program code which when executed by at least one processor causes operations comprising:
receiving, at a first bandpass filter, a differential signal, wherein the first bandpass filter comprises a resistive-capacitive configuration of N-path filters tunable to a first center frequency;
receiving, at a first notch filter, a first output of the first bandpass filter, wherein the first notch filter comprises a capacitive-resistive configuration of N-path filters tunable to a first notch center frequency;
receiving, at a second bandpass filter, a second output of the first notch filter, wherein the second bandpass filter comprises a resistive-capacitive configuration of N-path filters tunable to the first center frequency;
receiving, at a second notch filter, a third output of the second bandpass filter, wherein the second notch filter comprises a capacitive-resistive configuration of N-path filters tunable to a second notch center frequency;
receiving, at a third bandpass filter, a fourth output of the second notch filter, wherein the third bandpass filter comprises a resistive-capacitive configuration of N-path filters tunable to the first center frequency; and
outputting, by the third bandpass filter, a filtered output.

\* \* \* \* \*